United States Patent [19]

Yanase

[11] Patent Number: 5,668,350
[45] Date of Patent: Sep. 16, 1997

[54] ELECTRIC CONNECTION BOX

[75] Inventor: Takeshi Yanase, Shizuoka-ken, Japan

[73] Assignee: Yazaki Corporation, Tokyo, Japan

[21] Appl. No.: 735,064

[22] Filed: Oct. 18, 1996

[30] Foreign Application Priority Data

Oct. 20, 1995 [JP] Japan .................... 7-272851

[51] Int. Cl.$^6$ .................... H02G 3/08
[52] U.S. Cl. ............ 174/50; 174/17 R; 174/57; 220/3.2
[58] Field of Search .................... 174/50, 50.51, 174/17 R, 17 CT, 17.07, 50.6, 58, 57; 220/3.2, 3.8, 3.92, 3.94, 4.02

[56] References Cited

U.S. PATENT DOCUMENTS 4,747,488  5/1988  Kikuchi .................... 206/444

FOREIGN PATENT DOCUMENTS 1-58983  4/1989  Japan .

*Primary Examiner*—Hyung S. Sough
*Assistant Examiner*—Dhiru R. Patel
*Attorney, Agent, or Firm*—Finnegan, Henderson, Farabow, Garrett & Dunner, L.L.P.

[57] ABSTRACT

Since an opening of a lower cover and a side wall of an upper cover are formed in a trapezoid shape so that an upper width is larger than a lower width, a packing between fitting portions is suitably compressed on right and left inclined portions on the side wall and the opening only by fitting the upper cover to the lower cover from above. As a result, high waterproofing can be obtained.

2 Claims, 3 Drawing Sheets

ELECTRIC CONNECTION BOX

BACKGROUND OF THE INVENTION

The present invention relates to an electric connection box for protecting a junction block provided to an engine room, etc. of a car against water.

In general, an electric connection box accommodates a junction block equipped with electric parts such as a fuse, a relay and a connector in an inner space which is opened on a lower cover, and the opening of the lower cover is closed with an upper cover (see Japanese Unexamined Utility Model Laid-Open No. 1-58983). A packing is fixed to at least one of fitting portions of the upper cover and the lower cover. When the upper cover is fitted so as to cover the lower cover with the packing being sandwiched between the fitting portions, the packing is pressed, and thus water tightness between the fitting portions is improved. As a result, the junction block in the electric connection box is protected against water.

In such an electric connection box, after the junction block is installed to the lower cover, in order to connect harnesses below the junction block in the inner space, it is necessary to cut an opening on one basal side wall of the lower cover from an upper edge to a bottom side. In the case such an opening is formed, in order to obtain the above waterproof effect which is same as the case where the opening is not formed, a side wall which closes the opening is formed on the upper cover, and a packing is fixed to at least one of the fitting portions between the upper cover including the side wall and the lower cover including the opening.

However, if the opening of the lower cover and the side wall of the upper cover have a square shape whose right and left edges are approximately parallel with each other, when the upper cover is put on the lower cover from above, the right and left edges of the side wall are slid along the right and left edges of the opening, and thus the packing is pressed. As a result, the following problem arises. Namely, because of scattering in a dimension within a tolerance range of the manufacturing of the lower cover and the upper cover, when a width of the opening is too larger than a width of the side wall, for example, the packing between the right and left edges of the opening and the side wall is not sufficiently pressed, and thus satisfactory waterproofing is not obtained. On the contrary, when the width of the opening is too smaller than the width of the side wall, the packing between the right and left edges of the opening and the side wall is pressed excessively, and thus the fitting becomes difficult.

SUMMARY OF THE INVENTION

It is an object of the present invention to provide an electric connection box which is capable of obtaining secure waterproofing by only fitting an upper cover to a lower cover and by compressing the suitably suitably, and thus capable of improving quality and reliability.

In order to achieve the above invention, an electric connection box of the present invention is characterized by having a lower cover in which a junction block is stored in an upper portion of an inner space opened upward; an upper cover for closing an upper opening of the lower cover; an opening cut out on an basal side wall of the lower cover from an upper edge to a bottom side, the opening being formed in a trapezoid shape so that an upper width is larger than a lower width; a side wall for closing the opening when said upper cover is closed, the side wall being provided on the upper cover and being formed in a trapezoid shape so that an upper width is larger than a lower width; fitting portions being provided respectively to the upper cover including the side wall and the lower cover including the opening, the fitting portions being provided to at least right and left inclined portions on the side wall and the opening, the fitting portions facing each other when the upper cover is closed; and a waterproof packing sandwiched between the fitting portions when the lower cover is closed.

In such a manner, when the opening of the lower cover and the side wall of the upper cover are formed in a trapezoid shape that their upper width is larger than their lower width, the packing between the fitting portions formed on the right and left inclined portions are suitably pressed at the side wall and the opening only by fitting the upper cover to the lower cover from above. Therefore, the watertight is improved in the full fitting portions between the upper cover and the lower cover, and thus, the waterproofing is improved. As a result, the stability of quality and reliability can be improved.

In addition, angles of inclination of the fitting portions formed on the right and left inclined portions on the opening and the side wall can be symmetric.

In such a manner, when the angles of inclination of the fitting portions on the right and left inclined portions are symmetric, in the state that the upper cover is completely fitted to the lower cover (the lower cover is closed), the packing between the fitting portions are pressed uniformly on the light and left sides at the right and left inclined portions of the side wall and the opening. Therefore, the waterproofing can be further improved.

For a fuller understanding of the nature and advantages of the invention, reference should be made to the ensuing detailed description taken in conjunction with the accompanying drawings.

DESCRIPTION OF THE PREFERRED EMBODIMENTS

Figure 1:
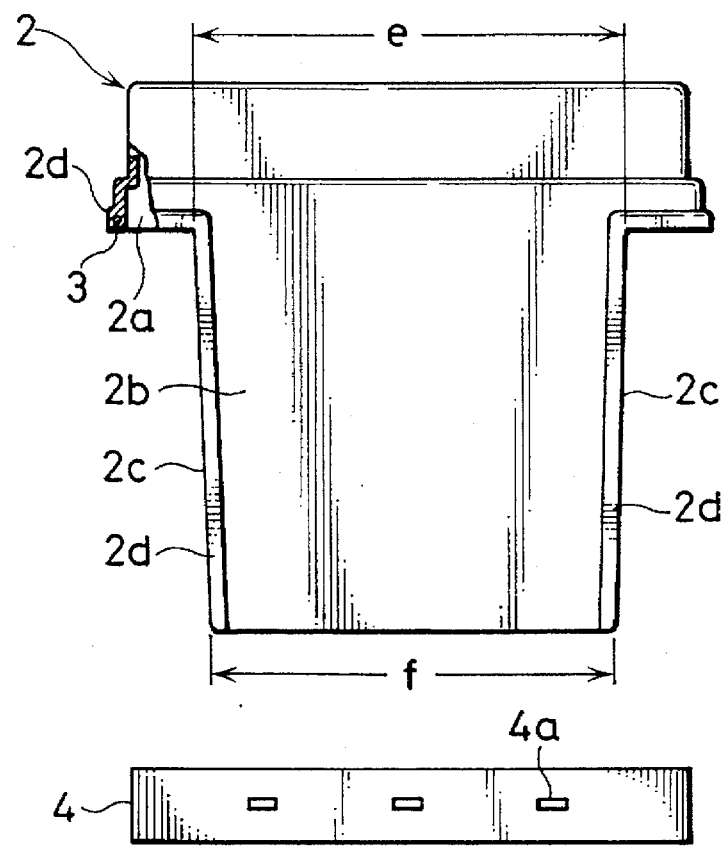
FIG. 1 is a side view which shows an assembly of embodiment of the present invention.
Figure 1:
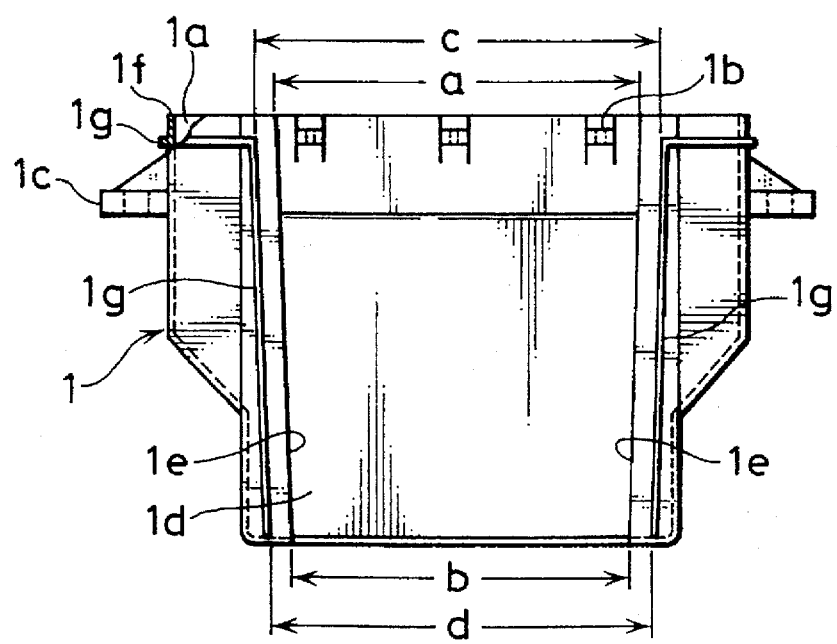

The following describes one embodiment of the present invention on reference to the drawings.

In FIGS. 1 through 6, a lower cover 1 has an inner space 1a which is opened upward. A plurality of receive sections 1b for installing a plurality of brackets 4a of a junction block 4 through screws, not shown, are formed on an upper portion on an inner surface of a basal side wall of the lower cover 1.

A plurality of supporting section 1c for installing the lower cover 1 to a fixing section provided to an inner section of an engine room of a car, not shown, are provided projectingly on an outer surface of the basal side wall of the lower cover 1.

An opening 1d for connecting harnesses below the junction block 4 in the inner space 1a is cut out on one basal side wall forming the inner space 1a from an upper edge to a bottom side. An operator can easily perform the connecting operation by inserting a hand, a jig, etc. into the inner space 1a of the lower cover 1 from the opening 1d even after the junction block 4 is installed The opening 1d has a trapezoid shape so that an upper width a is larger than a lower width b (a>b).

In the present embodiment, right and left edges (inclined edge) 1e of the opening 1d on the lower cover 1 and an upper opening edge 1f of the inner space 1a composes the fitting portion between the lower cover 1 and the upper cover 2. Angles of inclination of the light and left inclined edges 1e are formed so as to be symmetric.

Ribs 1g are projected from the outer surface of the inclined edges 1e and the outer surfaces of the opening edge. If so that edges of the ribs 1g are approximately parallel with each other. Therefore, the ribs 1g are approximately parallel along the inclined edges 1e in a portion around the opening 1d, an interval between the ribs 1g on the upper edge is larger than an interval d on the lower edge (c>d).

The upper opening of the lower cover 1 is closed by the upper cover 2. A side wall 2b which closes the opening 1d of the lower cover 1 is projected from one basal side wall of the upper cover 2 forming the inner space 2a opened downward. The side wall 2b, which corresponds to the opening 1d, has a trapezoid shape so that an upper width e is larger than a lower width f (e>f).

The above each dimension is set so that the relationship among them becomes a<c<e and b<d<f.

In addition, groove frame 2d composing the fitting portion between the upper cover 2 and the lower cover 1 is formed on right and left edges (inclined edge) 2c of the inclined portion of the side wall 2b of the upper cover 2 and the lower opening edge of the inner space 2a. Angles of inclination on the right and left inclined edges 2c on the groove frames 2d are symmetric.

As shown in FIGS. 2 through 5, the groove frame 2d is provided with an inner side flange 2e, an outer flange 2f and a groove 2g. The inner flange 2e is projected from a full opening edge of the upper cover 2 approximately flatly. The outer flange 2f is projected from the inner flange 2e so as to face the inner flange 2e at a prescribed interval. The groove 2g is formed so as to receive the full opening edge of the lower cover 1 through the outer flange 2f and the inner flange 2e.

An inner section of the groove 2g is filled with a packing 3 made of an elastic material such as rubber and synthetic resin.

Figure 4:
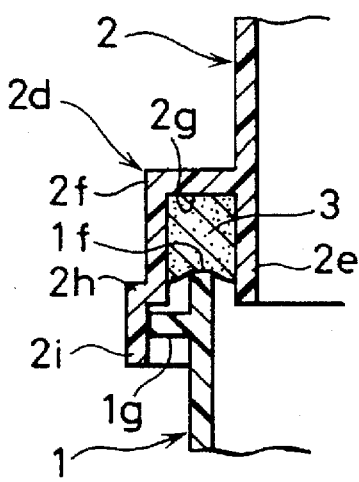
FIG. 4 is a cross sectional view which shows a final fitting state on the upper opening edge according to the embodiment.

On the groove frame 2d, the lower opening edge of the inner space 2a of the upper cover 2, as shown in FIG. 4, is provided with a projected section 2i which is extended lower than the inner flange 2e through a stepped section 2h which is projected outer from the outer flange 2f. The projected section 2i is formed so that its inner side receives the rib 1g of the lower cover 1.

Figure 2:
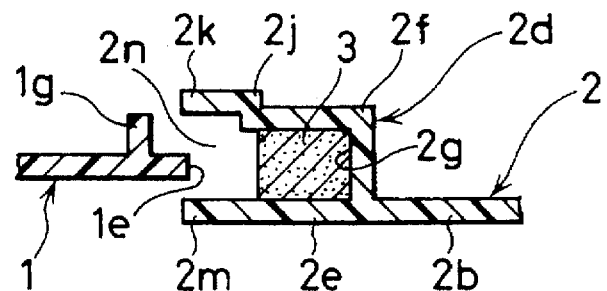
FIG. 2 is a cross sectional view which shows an initial fitting state on right and left edges of a side wall an opening according to the embodiment.
Figure 3:
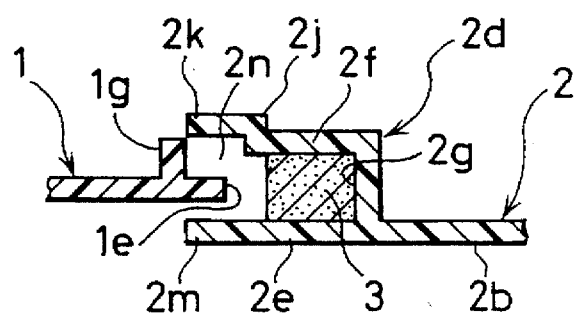
FIG. 3 is a cross sectional view which shows an immediate fitting state on the right and left edges of the side wall and the opening according to the embodiment.
Figure 5:
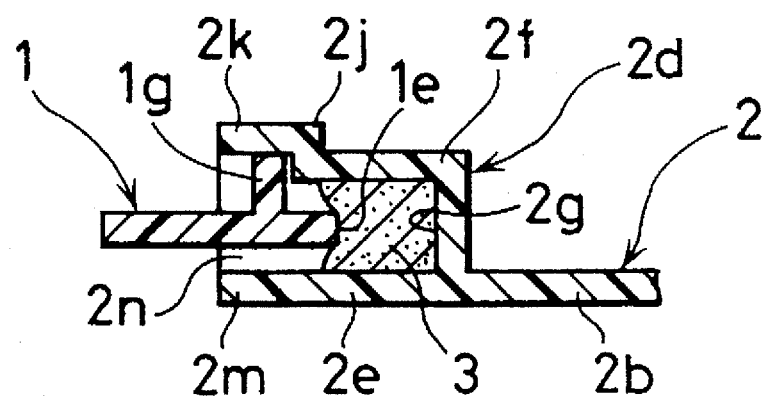
FIG. 5 is a cross sectional view which shows a final fitting state on the right and left edges of the side wall and the opening according to the embodiment.

In addition, as shown in FIGS. 2, 3 and 5, the inclined edge 2c of the side wall 2b has a projected section 2k. The projected section 2k is extended in a widthwise direction through the stepped section 2j extended outer from the outer flange 2f. The inner flange 2e is extended so as to have the same length as the extended section 2k and face the extended section 2k, and the inner flange 2e and the extended section 2k forms a circumferential end section 2m. The inner sides of the extended section 2k and the circumferential section 2m receive the inclined edge 1e of the opening 1d of the lower cover and the rib 1g.

The packing 3 is not provided to the extended section 2k and a groove opening 2n formed on the circumferential end section 2m.

The junction block 4 can be stored in the inner space 1a of the lower cover 1 and the inner space 2a of the upper cover 2. A plurality of brackets 4a are provided to the outer surface of the junction block 4 so as to correspond to the receiving section 1b of the lower cover 1.

In the above arrangement according to the present embodiment, the junction block 4 is stored in the inner space 1a of the lower cover 1 from above, and the bracket 4a of the junction block 4 is installed to the receiving section 1b of the lower cover 1a by screws, not shown. Thereafter, the upper cover 2 is fitted so as to cover the lower cover 1 from above.

In this case, when a lower edge of the side wall 2b of the upper cover 2 is inserted into the opening 1d of the lower cover 1 from above, as shown in FIG. 2, the inclined edge 1e of the opening 1d of the lower cover 1 is taken in the inner section of the groove opening 2n.

Next, when the side wall 2b of the upper cover 2 is transferred downward, as shown in FIG. 3, the inclined edge 1e of the opening 1d of the lower cover 1 is not brought into contact with the packing 3 in the groove opening 2n of the side wall 2b during the transfer.

When the upper cover 2 is transferred downwards, as shown in FIG. 4, an upper opening edge 1f in the inner space 1a of the lower cover 1 and the rib 1g are taken in the extended section 2i on the lower opening edge of the inner space 2a of the upper cover 2. Thereafter, the packing 3 comes into contact and presses the upper opening edge 1f in the inner space 1a of the lower cover 1.

At the same time, as shown in FIG. 5, after the rib 1g of the inclined edge 1e of the opening 1d of the lower cover 1 is taken in the extended section 2k on the inclined edge 2c of the side wall 2b of the upper cover 2, the packing 3 comes into contact with and presses the inclined edge 1e of the opening 1d of the lower cover 1.

Figure 6:
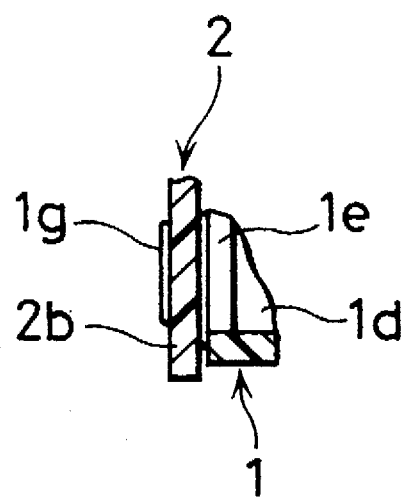
FIG. 6 is a cross sectional view which shows a completed fitting state on a lower edge of the side wall and the opening according to the embodiment.

Then, an engaging member and a an engaged member, not shown, provided to the upper cover 2 and the lower cover 1 are locked, and the upper cover 2 and the lower cover 1 are pressed by the locking operation so as to be close to each other. As a result, the packing 3 is slightly compressed by the inclined edge 1e and the upper opening edge 1f of the lower cover 1 shown in FIGS. 4 and 5, and as shown in FIG. 6, the full lower edge of the side wall 2b of the upper cover 2 covers the full lower edge of the opening 1d of the lower cover 1. Then, the upper cover 2 is fitted to and covers the lower cover 1 (the lower cover 2 is closed).

Particularly in the arrangement according to the present embodiment, the opening 1d of the lower cover 1 is formed in a trapezoid shape so that the upper width a is larger than the lower width b. Moreover, the side wall 2b of the upper cover 2 is formed in a trapezoid shape so that the upper width e is larger than the lower width f. As a result, the packing 3 can be suitably compressed in the full fitting portion between the upper cover 2 and the lower cover 1 only by fitting the upper cover 2 to the lower cover 1 from above. Therefore, the watertight in the full fitting portion is improved, and thus the waterproofing is improved, thereby improving stability and reliability in quality.

Furthermore, in accordance with the arrangement according to the present embodiment, the angles of inclination of the inclined edge 1e, the rib 1g and the groove frame 2d composing the fitting portion between the opening 1d of the lower cover 1 and the side wall 2b of the upper cover 2 are symmetric. As a result, the packing 3 is symmetrically compressed with the upper cover 2 fitted to and covered the lower cover 1. Therefore, the waterproofing is further improved.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An electric connection box comprising:

a lower cover in which a junction block is stored in an upper portion of an inner space opened upward;

an upper cover for closing an upper opening of said lower cover;

an opening cut out on a basal side wall of said lower cover from an upper edge to a bottom side, said opening being formed in a trapezoid shape so that an upper width is larger than a lower width;

a side wall for closing said opening when said upper cover is closed, said side wall being provided on said upper cover and being formed in a trapezoid shape so that an upper width is larger than a lower width;

fitting portions being provided respectively to said upper cover including said side wall and said lower cover including said opening, said fitting portions being provided to at least right and left inclined portions on said side wall and said opening, said fitting portions facing each other when said upper cover is closed; and a waterproof packing sandwiched between said fitting portions when said lower cover is closed.

2. The electric connection box as claimed in claim 1, wherein angles of inclination of said fitting portions formed on the right and left inclined portions on said opening and said side wall are symmetric.

\* \* \* \* \*